(12) United States Patent
Beck et al.

(10) Patent No.: US 6,665,325 B2
(45) Date of Patent: Dec. 16, 2003

(54) QUANTUM CASCADE LASER AND METHOD FOR MAKING SAME

(75) Inventors: Mattias Beck, Basel (CH); Jérôme Faist, Neuchâtel (CH); Antoine Muller, Neuchâtel (CH)

(73) Assignee: Alpes Lasers SA, Neuchatel (CH)

( * ) Notice: Subject to any disclaimer, the term of this patent is extended or adjusted under 35 U.S.C. 154(b) by 0 days.

(21) Appl. No.: 10/220,099

(22) PCT Filed: Feb. 26, 2001

(86) PCT No.: PCT/CH01/00123

§ 371 (c)(1),
(2), (4) Date: Aug. 27, 2002

(87) PCT Pub. No.: WO01/65651

PCT Pub. Date: Sep. 7, 2001

(65) Prior Publication Data

US 2003/0021315 A1 Jan. 30, 2003

(30) Foreign Application Priority Data

Mar. 3, 2000 (EP) .............................. 00810183

(51) Int. Cl.[7] ................................. H01S 5/22
(52) U.S. Cl. ....................................... 372/46
(58) Field of Search ........................... 372/46

(56) References Cited

U.S. PATENT DOCUMENTS

| | | | |
|---|---|---|---|
| 5,619,518 A | 4/1997 | Horie et al. | 372/46 |
| 5,789,772 A | 8/1998 | Jiang | 257/96 |
| 6,463,088 B1 * | 10/2002 | Baillargeon et al. | 372/46 |

FOREIGN PATENT DOCUMENTS

WO   WO 9840916   9/1998

OTHER PUBLICATIONS

Beck et al. "Buried heterostructure quantum cascade lasers" *Proc of the SPIE* 3248: 231–236; 1998.
Gmachl et al. "Continuous–Wave and High–Power Pulsed Operation of Index–Coupled Distributed Feedback Quantum Cascade Laser at Lambda=8.5 $\mu$m" *Appl Physics Letters* 72:12:1430–1432; Mar. 23, 1998.
Slivken et al. "High–Temperature Continuous–Wave Operation of Lambda 8 $\mu$m Quantum Cascade Lasers" *Appl Physics Letters* 74:2:173–175; Jan. 11, 1999.

* cited by examiner

*Primary Examiner*—James Davie
(74) *Attorney, Agent, or Firm*—Van Tassel & Associates

(57) ABSTRACT

The invention concerns a quantum cascade laser, comprising a substrate, a stack of layers, having a prismatic shape with substantially trapezoidal cross-section, comprising a lower surface arranged on the substrate, an upper surface and lateral surfaces, said stack forming a gain region and two walls between which the region is interposed, two electrodes arranged on either side of the stack, one of which is formed by an electrically conductive material layer covering at least partially the surface of the stack opposite the substrate, and an electrically insulating layer interposed between the two electrodes. The invention is characterised in that the electrically insulating layer completely covers the lateral surfaces of the prism, without overlapping on the upper surface, and its thickness is equal to at least a third of the stack thickness.

7 Claims, 4 Drawing Sheets

QUANTUM CASCADE LASER AND METHOD FOR MAKING SAME

FIELD OF THE INVENTION

Figure 1A:
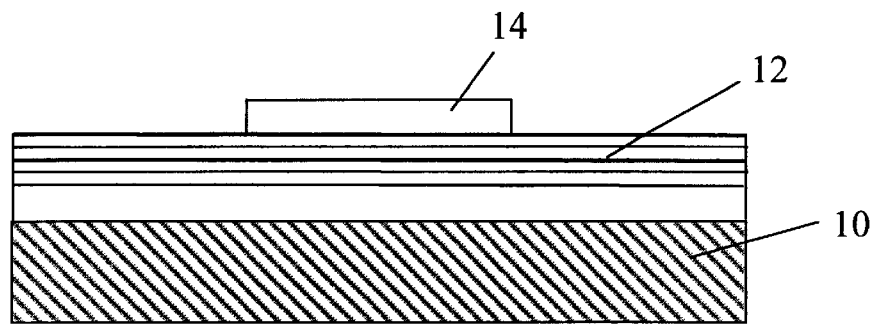

The present invention concerns quantum cascade semiconductor lasers. In the present application, quantum cascade semiconductor laser means a laser in which the gain is due to carriers performing inter-sub-band transitions in a semiconductor heterostructure.

BACKGROUND OF THE INVENTION

A laser of this type is, for example, described in the document entitled "Buried heterostructure quantum cascade lasers," published in SPIE Vol. 3284 0277 -788X98. its structure and the production process employed will be explained In detail in the following description, with reference to FIGS. 1a–1e.

Such lasers comprise a substrate of indium phosphide (InP), doped with silicon, on which is arranged a stack of very thin layers forming the laser waveguide. The stack has a prismatic structure, of substantially trapezoidal cross-section, of which the lower surface, forming the large base of the trapeze, rests on the substrate.

The lower and upper surfaces are each formed of layers of alloys of indium gallium arsenide (InGaAs) and of aluminium indium arsenide (AlInAs) forming a cladding.

A series of layers of aluminium indium arsenide (AlInAs) and indium gallium arsenide (InGaAs) forms the active zone of the laser, which is arranged between the two claddings.

To perform injection of an electric current in the active region, the laser also includes two electrodes. The first electrode is formed by the substrate. The second is embodied by means of a metallic layer placed above the substrate and in contact, on at least part of the upper surface of the stack. An electrically insulating layer, in InP, supports the metallic layer, except for the contact region.

The manufacture of such a laser involves using a substrate doped with InP, so as to make it conductive, to form the first electrode. Successive layers are then deposited, which form the stack. These layers are then attacked, conventionally, by photolithography. We thus obtain the prismatic structure of trapezoidal cross-section.

The assembly thus obtained is covered, by molecular-beam epitaxy, with a layer of InP covering the entire upper surface of the device at this stage of manufacturing. A further photolithography operation enables an opening to be made in the region covering the upper surface of the stack. The edges of the opening, consisting of the side edge of the electrically insulating layer, thus form the well at the bottom of which is located the upper surface of the stack. The metallic layer, for example chromium, is then deposited on the electrically insulating layer and on the upper surface of the stack, to form the second electrode.

By applying an electric voltage between the lower and upper surfaces of the stack, i.e. between the two electrodes, one injects into it an electric current which generates the laser radiation.

These lasers have the advantage of being able to be built to operate in a large part of the medium infrared spectrum (approximately 3 to 20 $\mu$m wavelength) using the same basic semiconductor materials.

Lasers having similar structures, to which the present invention can be applied, have been described, in particular, in patent applications WO 99/00572 and FR 99 03845.

The operation of these lasers depends to a considerable extent on the temperature of the stack during emission. Now, when the laser is activated, a large proportion of the energy is transformed into heat. This heat is basically dissipated by diffusion in the substrate. The dissipation is relatively slow, which therefore considerably limits the conditions of use.

In the device manufactured as described above, it is advantageous for the electrically insulating layer to be as thick as possible, because InP is a good heat conductor. This makes it possible to avoid an excessive rise in temperature. Unfortunately, the thicker the layer, the harder it is to control etching with a view to forming the cutout designed to allow electrical contact between the electrode and the upper surface of the stack.

Moreover, the deposition of InP by molecular-beam epitaxy requires a cleaning operation under ultra-vacuum, which is difficult and costly.

In addition, the insulation function is based on the quality of a Schottky barrier, which is also hard to control.

SUMMARY OF THE INVENTION

The aim of the present invention is to permit the manufacture of lasers in which the electrically insulating layer ensures optimum heat dissipation, in a reproducible way and for a reasonable cost.

This aim is achieved thanks to the fact that the electrically insulating layer covers said lateral surfaces completely, without overlapping on the upper surface, and due to the fact that its thickness is equal to at least one third of the thickness of the stack. Such a thickness is sufficient to permit good thermal diffusion.

Although the stack is not very thick, it forms a protuberance which means that the assembly has a non-planar structure. Accordingly, the laser can be attached to a mounting only by its substrate. Now, the possibility of laser assembly on one or other surface indifferently simplifies the assembly operations. In cases where thermal dissipation plays a major role, it is advantageous to have a mounting that is highly heat-conducting, in direct contact with the electrically insulating layer. That is why, in a particular embodiment, the electrically insulating layer covers the substrate at least in the zone adjacent to the stack and has a thickness at least equal to that of the stack.

Advantageously, the thickness of the electrically insulating layer is equal to that of the stack. It is however foreseeable, for certain applications, to build an electrically insulating layer the thickness of which is greater than that of the stack. In this case too, thermal diffusion is improved and the flatness of the second surface is ensured.

In a particularly advantageous embodiment, the substrate is of semiconductor material doped to make it conducting.

Of the various types of quantum cascade semiconductor lasers, those having the following characteristics gave especially good results:
- the substrate is formed of a plate in indium phosphide (InP), doped with silicon;
- the claddings are each formed by layers of indium gallium arsenide alloy (InGaAs) and aluminium indium arsenide alloy;
- the active region is formed of a series of layers of aluminium indium arsenide (AlInAs) and indium gallium arsenide (InGaAs), and
- the electrically insulating layer is of InP.

In an initial variant, the indium phosphide forming the electrically insulating layer is of semi-insulating type, through iron doping.

In another variant, the indium phosphide forming the electrically insulating layer is of non-doped type.

The present invention also concerns a process for manufacturing a laser as described above. Extremely interesting results were obtained by applying a process involving the following operations:

deposition of layers designed to form the stack;

deposition of a masking layer;

etching of the masking layer outside of the zone designed to form the stack;

etching of the layers designed to form the stack outside of the masked zone;

metal organic chemical vapour deposition (MOCVD) of an electrically insulating layer on the non-masked parts, until a thickness at least equal to one-third of the stack thickness is reached;

removal of the masking layer, and deposition of a layer covering in particular the stack on its upper surface.

Since only the upper surface of the prism is masked, the result is that the lateral surfaces are entirely covered by the electrically insulating layer while the upper surface is completely spared.

Advantageously, the operation of deposition of the electrically insulating layer is performed until a thickness substantially equal to the stack thickness is reached.

To avoid the layer of insulating material being deposited on the masking layer, it is advantageous for the latter layer to be made of silicon dioxide ($SiO_2$).

BRIEF DESCRIPTION OF THE INVENTION

Other advantages and characteristics of the invention will appear from the following description, made with reference to the appended drawings, in which:

FIGS. 1a–2e represents, schematically, a laser corresponding to the state of the art, during various stages of its manufacture, and FIGS. 2a–2e shows, by the same schematic approach, a laser according to the invention at various stages of its manufacture.

DETAILED DESCRIPTION OF THE PREFERRED EMBODIMENTS

To facilitate en understanding of the invention, a laser of known type, described in the article that appeared in the SPIE review mentioned above, will therefore be described briefly, with reference to FIGS. 1a–1e on this figure, the dimensions of the various parts making up the laser are chosen to facilitate reading of the drawing. They are not significant of the real dimensions.

FIG. 1a shows a baseplate, forming a substrate 10, coated with a layer stack 12 which, after various operations, will form the laser waveguide, consisting of an active region and two claddings between which the latter is sandwiched.

The stack 12 carries a masking layer 14, covering it locally in the zone to be spared.

Conventionally, the substrate 10 is produced by means of a single-crystal plate of indium phosphide (InP) doped with silicon. The stack 12 is formed of an alternation of layers of aluminium indium arsenide (AlInAs) and indium gallium arsenide (InGaAs), which form two claddings and an active region.

The masking layer 14 is of silicon dioxide ($SiO_2$), deposited initially on the entire surface, with the parts to be removed being removed by photolithography. As a variant, it is also possible to produce the masking layer directly by means of the resin used in the photolithography process.

Figure 1B:
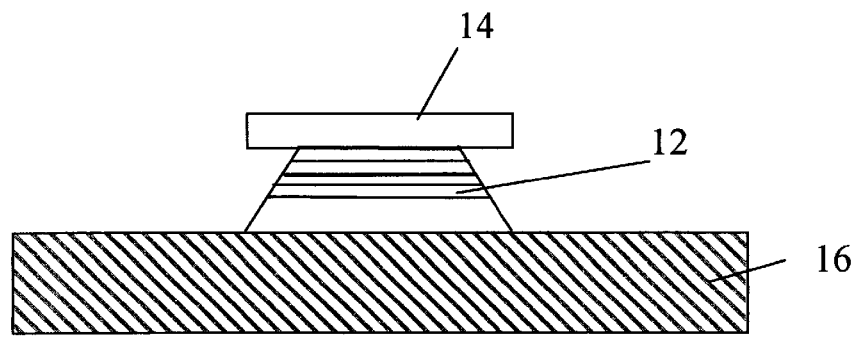
Figure 1C:
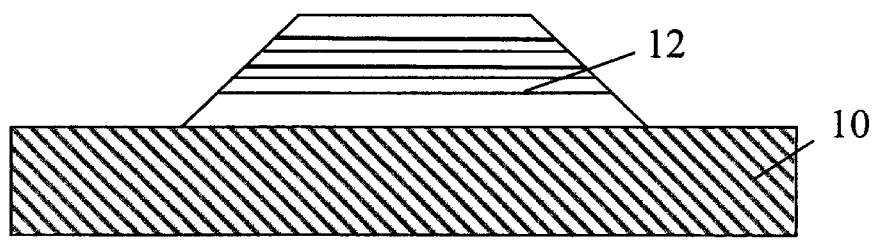

The assembly thus obtained is then subjected to etching, which removes the layers forming the stack, with the exception of the masked zone. As shown by FIG. 1b, the stack 12 then takes the form of a prism of substantially trapezoidal cross-section, the large base of which is in contact with the substrate 10, while the small base is covered by masking layer 14. The latter is then removed, to obtain the structure shown in FIG. 1c. The shape of the prism's cross-section is defined by the means used during etching of the layers forming the stack in the non-masked zones. It does not influence the laser's operation.

Figure 1D:
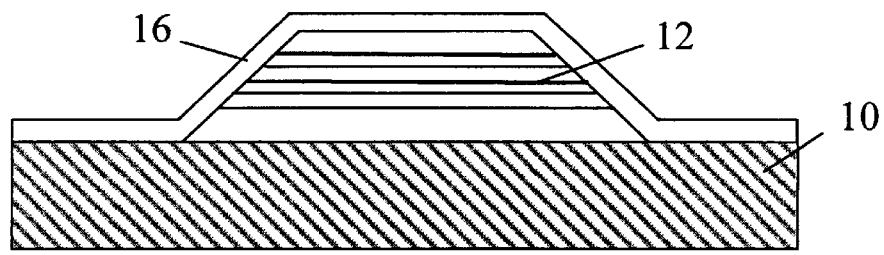

During the following operation, illustrated in FIG. 1d, the entire surface is covered with an electrically insulating layer 16 of InP, by molecular-beam epitaxy. This layer can be manufactured by means of InP as pure as possible, i.e. non-doped. It is also possible to use InP doped with iron, to obtain a layer of material commonly called semi-insulating, as described in the publication mentioned above.

Figure 1E:
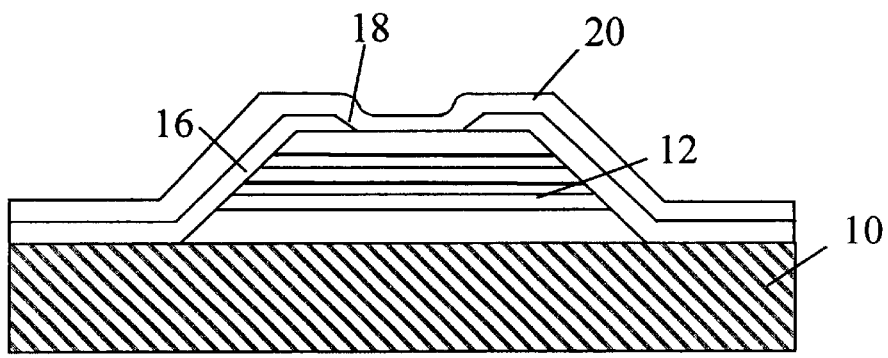

Layer 16 is then etched locally by photolithography, to clear an opening 18 in the part covering the upper surface of the stack. The whole is then covered is with a layer of conducting material forming an electrode 20, e.g. chromium, as shown in FIG. 1e.

In the device manufactured as described above, it is advantageous for the electrically insulating layer to be as thick as possible, because InP is a good conductor of heat. It is thus possible to avoid an excessive rise in temperature. Unfortunately, the thicker the layer, the harder it is to control etching with a view to forming the cutout designed to allow electrical contact between the electrode and the upper surface of the stack.

The deposition of InP by molecular-beam epitaxy requires a cleaning operation under ultra-vacuum, which is difficult and costly.

Moreover, the insulation function is based on the quality of a Schottky barrier, which is also hard to control.

Finally, although the stack is not very thick, it forms a protuberance which means that the assembly has a non-planar structure. Accordingly, the substrate can be attached to a mounting only by its surface opposite that carrying the stack.

Figure 2A:
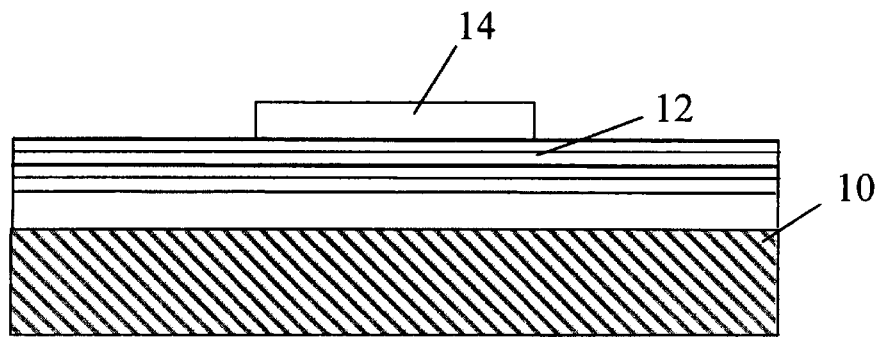
Figure 2B:
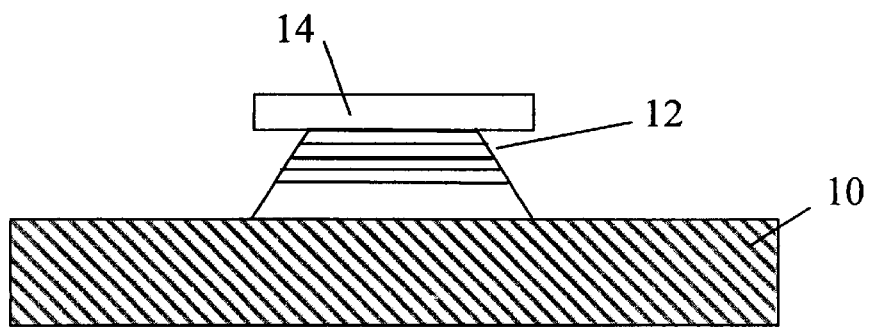

Referring to FIG. 2, one observes that, in the process according to the invention, the operations shown in FIGS. 1a and 1b are found identically on FIGS. 2a and 2b, with a substrate 10, a stack 12 and a masking layer 14.

Figure 2C:
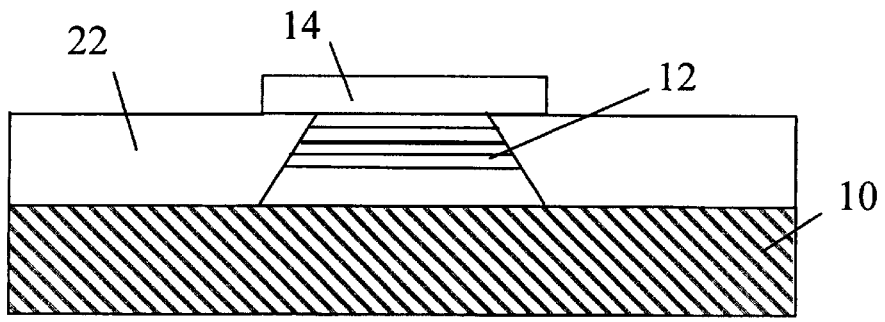

The following operation, illustrated in FIG. 2c, involves depositing the electrically insulating layer 22, while preserving masking layer 14. This operation is performed by metal organic chemical vapour deposition (MOCVD) of InP. Such a process is described comprehensively in the work entitled "Materials Aspects of GaAs and InP Based Structures" by V. Swaminathan and A. T. Macrander, Prentice Hall Advanced Reference series, ISBN 0-13-346826-7.

This process permits the deposition of relatively thick layers, completely covering the lateral surfaces of the prism until contact with the masking layer 14. Accordingly, the electrically insulating layer cannot overlap the upper surface of the prism. Advantageously, deposition is interrupted at the time when the thickness of layer 22, in InP, is equal to that of the stack 12.

Figure 2D:
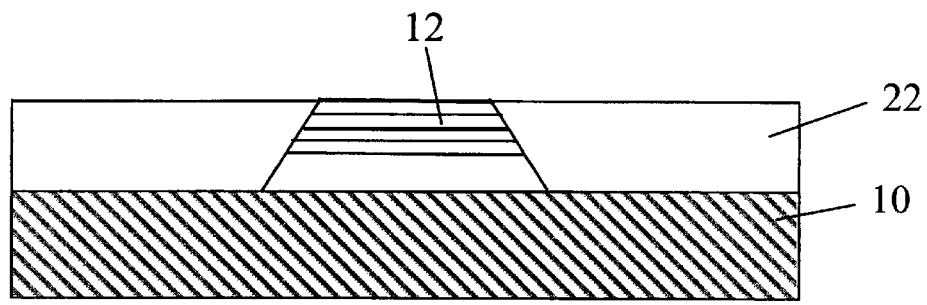
Figure 2E:
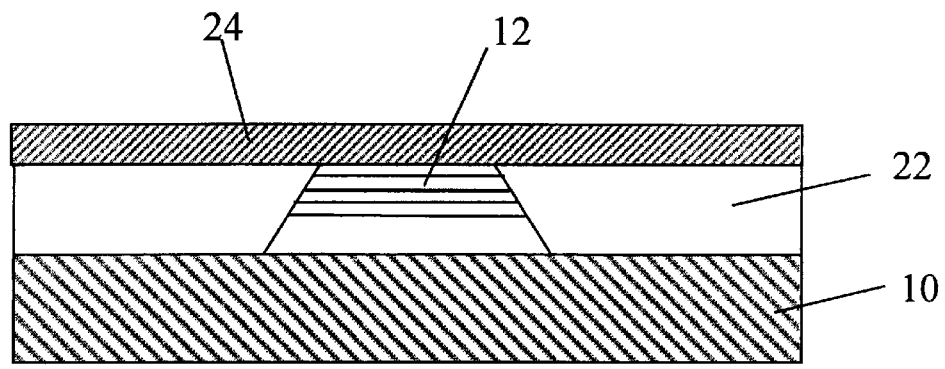

As can be seen on FIG. 2d, the masking layer 14 is next removed, and then a conducting layer 24, in chromium for example, is deposited, forming an upper contact electrode as can be seen in FIG. 2e.

The substrate of doped InP acts as lower electrode. Accordingly, by applying a voltage between the two electrodes, it is possible to inject a current into the stack, to cause the emission of coherent light.

It is also possible to produce an electrically insulating layer 22 far thicker than stack 12. In this case, the upper surface of the prism will be located at the bottom of a groove. Such a structure can also ensure good thermal diffusion. As the area of the upper surface of the prism is small relative to the total area of the substrate, the assembly thus obtained takes the form of a plate the two surfaces of which are plane and parallel, with one of the latter having a groove at the stack level.

It goes without saying that it is possible to manufacture several lasers on a single substrate. The latter can then be cut out into wafers, each of them comprising one or more lasers. These wafers are arranged on a mounting also carrying electronic control circuits, designed to power the laser.

It is obvious that many variants can be considered, although without going outside the framework of the invention. Thus, it is also possible to use a substrate in insulating material, covered by a conducting layer, the latter acting as electrode.

The structure of the stack can, of course, also include many configuration variants, for example those described in patent applications WO 99/00572 and FR 99 03845.

What is claimed is:

1. Quantum cascade semiconductor laser, comprising
a substrate (10);
a stack (12) of layers, of prismatic shape with substantially trapezoidal cross-section, with a lower surface arranged on the substrate (10), an upper surface and lateral surfaces, said stack forming a gain region and two claddings between which the gain region is inserted;
two electrodes (10, 24) arranged on either side of the stack (12), one of which (24) is formed of a layer of electrically conducting material covering at least partially the surface of the stack opposite the substrate, and
an electrically insulating layer (22) placed between the two electrodes;
characterized in that said electrically insulating layer (22) covers said lateral surfaces completely, without overlapping the upper face, and in that its thickness is equal to at least one third of the thickness of the stack (12).

2. Laser according to claim 1, characterized in that said electrically insulating layer (22) covers said substrate (10) at least in the zone adjacent to said stack (12), and has a thickness at least equal to that of the stack.

3. Laser according to claim 2, characterized in that the thickness of the electrically insulating layer (22) is substantially equal to the thickness of the stack (12).

4. Laser according to claim 3, characterized in that said substrate (10) is of semiconductor material doped to make it conducting.

5. Laser according to claim 4, characterized in that:
said substrate (10) is formed of a plate in indium phosphide (InP), doped with silicon;
said claddings are each formed by layers of indium gallium arsenide alloy (InGaAs) and aluminium indium arsenide alloy;
the active region is formed of a series of layers of aluminium indium arsenide (AlInAs) and indium gallium arsenide (InGaAs), and in that
said electrically insulating layer (22) is in indium phosphide.

6. Laser according to claim 5, characterized in that the indium phosphide forming the electrically insulating layer (22) is of semi-insulating type, by doping with iron.

7. Laser according to claim 5, characterized in that the indium phosphide forming the electrically insulating layer (22) is non-doped.

* * * * *